(12) United States Patent
Ahn et al.

(10) Patent No.: US 8,890,139 B2
(45) Date of Patent: Nov. 18, 2014

(54) SOLUTION COMPOSITION FOR PASSIVATION LAYER, THIN FILM TRANSISTOR ARRAY PANEL, AND MANUFACTURING METHOD FOR THIN FILM TRANSISTOR ARRAY PANEL

(75) Inventors: Byung Du Ahn, Hwaseong-si (KR); Seung Ho Yeon, Daejeon (KR); Sei-Yong Park, Suwon-si (KR); Mi-Hyae Park, Daejeon (KR); Bu Sop Song, Daejeon (KR); Tae Gweon Lee, Daejeon (KR); Jun Hyun Park, Suwon-si (KR); Je Hun Lee, Seoul (KR); Jae Woo Park, Seongnam-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/534,752

(22) Filed: Jun. 27, 2012

(65) Prior Publication Data
US 2013/0099228 A1 Apr. 25, 2013

(30) Foreign Application Priority Data
Oct. 19, 2011 (KR) .................. 10-2011-0106990

(51) Int. Cl.
*H01L 29/10* (2006.01)
*H01L 29/12* (2006.01)
(Continued)

(52) U.S. Cl.
CPC .............. *H01L 29/517* (2013.01); *C08G 77/16* (2013.01); *G02F 1/136227* (2013.01); *H01L 27/1225* (2013.01); *H01L 27/1288* (2013.01);
(Continued)

(58) Field of Classification Search
CPC ... H01L 29/7869; H01L 29/24; H01L 21/479; H01L 21/00; H01L 21/16
USPC .......................................................... 257/43
See application file for complete search history.

(56) References Cited

U.S. PATENT DOCUMENTS 6,563,174 B2 5/2003 Kawasaki et al.
7,262,463 B2 8/2007 Hoffman
(Continued)

FOREIGN PATENT DOCUMENTS

JP 05-251705 9/1993
JP 2007-073703 3/2007
(Continued)

*Primary Examiner* — Anthony Ho
(74) *Attorney, Agent, or Firm* — F. Chau & Associates, LLC

(57) ABSTRACT

A passivation layer solution composition is provided. A passivation layer solution composition according to an exemplary embodiment of the present invention includes an organic siloxane resin represented by Chemical Formula 1 below.

[Chemical Formula 1]

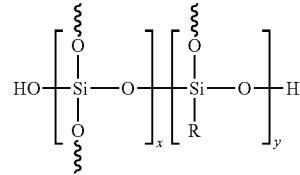

In Chemical Formula 1, R is at least one substituent selected from a saturated hydrocarbon or an unsaturated hydrocarbon having from 1 to about 25 carbon atoms, and x and y may each independently be from 1 to about 200, and wherein each wavy line indicates a bond to an H atom or to an x siloxane unit or a y siloxane unit, or a bond to an x siloxane unit or a y siloxane unit of another siloxane chain comprising x siloxane units or y siloxane units or a combination thereof.

9 Claims, 12 Drawing Sheets

(51) Int. Cl.
*H01L 29/51* (2006.01)
*G02F 1/1362* (2006.01)
*H01L 23/29* (2006.01)
*C08L 83/04* (2006.01)
*C08G 77/16* (2006.01)
*H01L 27/12* (2006.01)
*C08G 77/00* (2006.01)
*C08G 77/20* (2006.01)
*H01L 27/32* (2006.01)

(52) U.S. Cl.
CPC ............. *H01L 23/296* (2013.01); *C08G 77/80* (2013.01); *C08L 83/04* (2013.01); *H01L 27/1248* (2013.01); *C08G 77/20* (2013.01); *H01L 27/3258* (2013.01)
USPC .......................................................... 257/43

(56) References Cited

U.S. PATENT DOCUMENTS

| | | | |
|---|---|---|---|
| 7,382,421 | B2 | 6/2008 | Hoffman et al. |
| 7,453,087 | B2 | 11/2008 | Iwasaki |
| 7,601,984 | B2 | 10/2009 | Sano et al. |
| 2004/0033700 | A1* | 2/2004 | Gronbeck et al. ............ 438/781 |
| 2007/0075322 | A1* | 4/2007 | Nakamura et al. ............... 257/97 |
| 2008/0023703 | A1 | 1/2008 | Hoffman et al. |
| 2008/0128689 | A1 | 6/2008 | Lee et al. |
| 2009/0072232 | A1 | 3/2009 | Hayashi et al. |
| 2009/0189156 | A1 | 7/2009 | Akimoto |
| 2009/0278120 | A1 | 11/2009 | Lee et al. |
| 2009/0289250 | A1 | 11/2009 | Hoffman et al. |
| 2010/0044703 | A1 | 2/2010 | Yabuta et al. |
| 2010/0051935 | A1* | 3/2010 | Lee et al. ........................ 257/43 |
| 2010/0059746 | A1 | 3/2010 | Itai |

FOREIGN PATENT DOCUMENTS

| | | |
|---|---|---|
| JP | 2009-141001 | 6/2009 |
| JP | 2009-141002 | 6/2009 |
| JP | 2010-067710 | 3/2010 |
| JP | 2010-067954 | 3/2010 |
| KR | 100490924 | 5/2005 |
| KR | 1020080052107 | 6/2008 |
| KR | 1020080095540 | 10/2008 |
| KR | 100889796 | 3/2009 |
| KR | 100911698 | 8/2009 |
| KR | 1020090089444 | 8/2009 |
| KR | 1020090089450 | 8/2009 |
| KR | 1020090122815 | 12/2009 |
| KR | 100939998 | 1/2010 |

* cited by examiner

SOLUTION COMPOSITION FOR PASSIVATION LAYER, THIN FILM TRANSISTOR ARRAY PANEL, AND MANUFACTURING METHOD FOR THIN FILM TRANSISTOR ARRAY PANEL

CROSS-REFERENCE TO RELATED APPLICATION

This application claims priority to and the benefit of Korean Patent Application No. 10-2011-0106990 filed in the Korean Intellectual Property Office on Oct. 19, 2011, the entire contents of which are incorporated by reference herein.

TECHNICAL FIELD

The present invention relates to a passivation layer solution composition, a thin film transistor array panel and a method for manufacturing the thin film transistor array panel.

DESCRIPTION OF THE RELATED ART

Generally, a thin film transistor (TFT) array panel is used as a circuit board for independently driving pixels in a liquid crystal display or an organic electro-luminescent (EL) display device. The thin film transistor array panel includes a scanning signal line or a gate line transmitting a scanning signal, an image signal line or a data line transmitting an image signal, a thin film transistor connected to the gate line and the data line, and a pixel electrode connected to the thin film transistor.

The thin film transistor includes a gate electrode that is a portion of the gate wire, a semiconductor layer forming a channel, a source electrode that is a portion of the data wire, and a drain electrode. The thin film transistor is a switching element controlling an image signal transmitted to the pixel electrode through the data wire according to the scanning signal transmitted through the gate line.

When using the oxide semiconductor as the semiconductor layer and copper as a wire having low resistance, when using a passivation layer made of a conventional silicon oxide or silicon nitride, desirable thin film transistor characteristics are not realized and the wiring surface may be oxidized.

SUMMARY OF THE INVENTION

An embodiment of the present invention provides a passivation layer solution composition, a thin film transistor array panel, and a manufacturing method thereof to provide solutions to the above problems when using an oxide semiconductor as a semiconductor layer and copper as a wire having low resistance.

A passivation layer solution composition according to an exemplary embodiment of the present invention includes an organic siloxane resin represented by Chemical Formula 1 below:

[Chemical Formula 1]

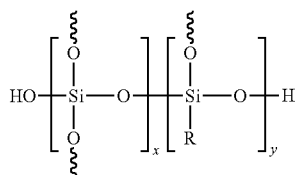

In an exemplary embodiment of the present invention, each of the R groups of Chemical Formula 1 is independently a substituent selected from the group consisting of a saturated hydrocarbon and an unsaturated hydrocarbon having from 1 to about 25 carbon atoms, and x and y are each an integer from 1 to about 200, and each wavy line wherein each wavy line indicates a bond to an H atom or to an x siloxane unit or a y siloxane unit, or a bond to an x siloxane unit or a y siloxane unit of another siloxane chain comprising x siloxane units or y siloxane units or a combination thereof.

In an exemplary embodiment of the present invention, the organic siloxane includes at least one substituent selected from the group consisting of a saturated hydrocarbon and an unsaturated hydrocarbon having from 1 to about 25 carbon atoms, and includes from about 200 to about 400 Si atoms.

In exemplary embodiment, each R substituent in Chemical Formula 1 is independently selected from the group consisting of a methyl group, a vinyl group, and a phenyl group.

In an exemplary embodiment the passivation layer solution composition may further include a solvent containing propylene glycol monomethylether or propylene glycol monoethylacetate.

In an exemplary embodiment the passivation layer solution composition may include from about 4 wt % to about 25 wt % of an organic siloxane resin of the invention.

In an embodiment of the organic siloxane resin of the invention, each of the R groups in Chemical Formula 1 is independently selected from the group consisting of a methyl group, a vinyl group, and a phenyl group.

In an exemplary embodiment the organic siloxane resin has a molecular weight of from about 100 to about 10,000.

In an exemplary embodiment the thin film array panel includes: a substrate; a gate line, a semiconductor layer, a source electrode, and a data line including a drain electrode disposed on the substrate; and a passivation layer disposed on the gate line, the semiconductor layer, and the data line and includes an organic siloxane resin represented by Chemical Formula 1 below.

[Chemical Formula 1]

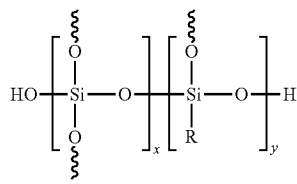

In Chemical Formula 1, each of the R groups is a substituent selected from the group consisting of a saturated hydrocarbon or an unsaturated hydrocarbon having from 1 to about 25 carbon atoms, and x and y are each independently an integer from 1 to about 200, and wherein each wavy line indicates a bond to an H atom or to an x siloxane unit or a y siloxane unit, or a bond to an x siloxane unit or a y siloxane unit of another siloxane chain comprising x siloxane units or y siloxane units or a combination thereof.

In an exemplary embodiment the semiconductor layer of the thin film array panel may be formed of an oxide semiconductor.

In an exemplary embodiment the gate line of the thin film array panel may include a lower layer including at least one metal selected from titanium, tantalum, and molybdenum, and an upper layer that includes copper or a copper alloy.

In an exemplary embodiment the data line of the thin film array panel may include a lower layer that includes at least one metal selected from titanium, tantalum, and molybdenum; and an upper layer that includes copper or a copper alloy.

In an exemplary embodiment the thin film transistor array panel may further include a pixel electrode disposed on the passivation layer, the passivation layer having a contact hole, and the pixel electrode being connected to the drain electrode through the contact hole.

In an exemplary embodiment each of the R groups of Chemical Formula 1 is a substituent independently selected from the group consisting of a methyl group, a vinyl group, and a phenyl group.

In an exemplary embodiment the organic siloxane resin has a molecular weight of from about 100 to about 10,000.

In an exemplary embodiment the thin film transistor array panel may further include a gate insulating layer disposed on a substrate.

In an exemplary embodiment the gate insulating layer may include at least one silicon compound selected from the group consisting of silicon oxide, silicon nitride, and silicon oxynitride.

A method of manufacturing a thin film transistor array panel according to an exemplary embodiment of the present invention includes forming a thin film transistor including a gate line, a semiconductor layer, a source electrode, and a data line on a substrate, coating a solution including an organic siloxane resin represented by Chemical Formula 1 and covering the thin film transistor on the substrate to form a preliminary passivation layer, illuminating the preliminary passivation layer by using a mask, and developing the preliminary passivation layer to form a passivation layer having a contact hole.

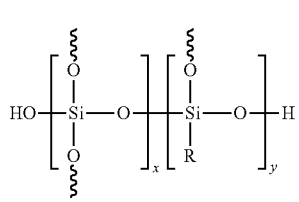

[Chemical Formula 1]

In an exemplary embodiment of the thin film transistor array panel manufacturing method according to the present invention, in Chemical Formula 1, each of the R groups is independently selected from the group consisting of a saturated hydrocarbon and an unsaturated hydrocarbon having from 1 to about 25 carbon atoms, and x and y are each independently an integer from 1 to about 200, and each wavy line represents a bond to an H atom, or a crosslinking covalent bond to an x or a y siloxane unit of another siloxane chain having the structure of Chemical Formula 1

The solution that includes the organic siloxane resin represented by Chemical Formula 1 may include either or both of propylene glycol monomethylether and propylene glycol monoethylacetate.

The solution that includes the organic siloxane resin represented by Chemical Formula 1 includes from about 4 wt % to about 25 wt % of the organic siloxane resin.

In the organic siloxane resin represented by Chemical Formula 1, each R group is independently selected from the group consisting of a methyl group, a vinyl group, and a phenyl group.

The organic siloxane resin may have a molecular weight of from about 100 to about 10,000.

The semiconductor layer may be formed of an oxide semiconductor.

The gate line may be formed of a lower layer including at least one metal selected from titanium, tantalum, and molybdenum; and an upper layer that includes copper or a copper alloy.

The data line may be formed of a lower layer including at least one metal selected from titanium, tantalum, and molybdenum; and an upper layer that includes copper or a copper alloy.

When using the passivation layer including the organic siloxane resin according to an embodiment of the present invention, it is not necessary to form an additional capping layer on the wiring when using wiring having low resistance such as copper, and an excellent thin film transistor characteristic may be obtained using a semiconductor layer of an oxide semiconductor.

DETAILED DESCRIPTION OF THE EMBODIMENTS

Figure 1:
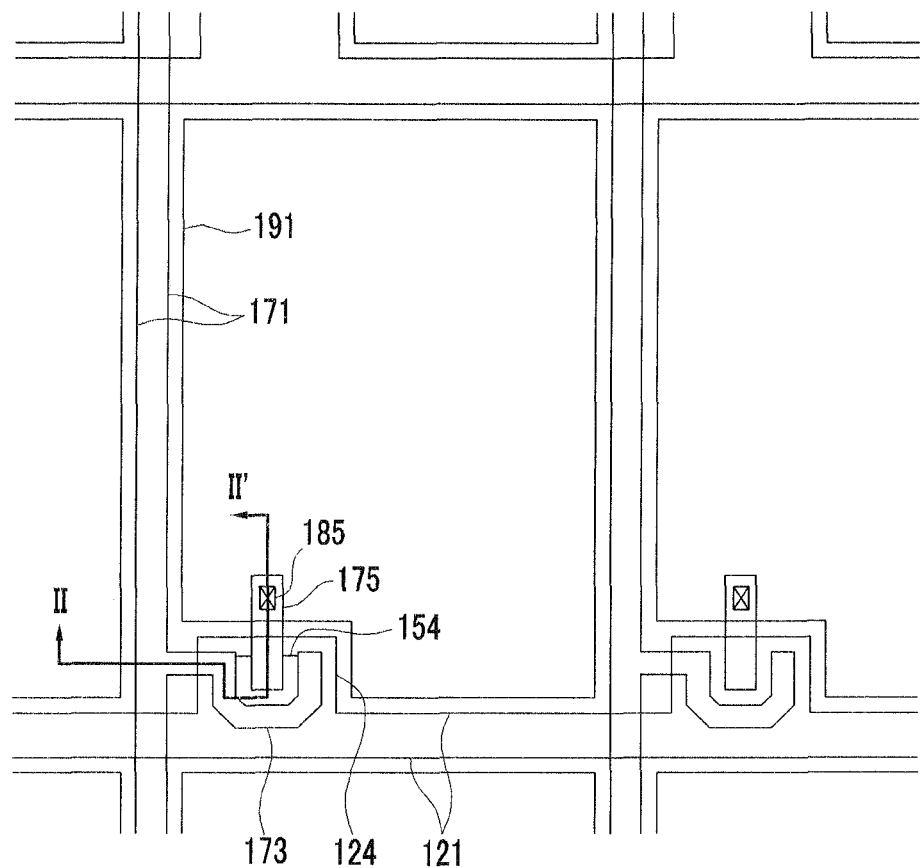
FIG. 1 is a layout view of one pixel of a thin film transistor array panel according to an exemplary embodiment of the present invention.

Exemplary embodiments of the present invention will be described in detail with reference to the accompanying drawings. However, the present invention is not limited to the exemplary embodiments described herein, and may be embodied in other forms. Rather, exemplary embodiments described herein are provided to thoroughly and completely understand the disclosed contents and to sufficiently transfer the ideas of the present invention to a person of ordinary skill in the art.

In the drawings, the thicknesses of layers and regions are exaggerated for clarity. It is to be noted that when a layer is referred to as being "on" another layer or substrate, it can be directly formed on the other layer or substrate or can be formed on the other layer or substrate with a third layer interposed therebetween. Like constituent elements are denoted by like reference numerals throughout the specification.

A passivation layer solution composition according to an exemplary embodiment of the present invention includes an organic siloxane resin represented by Chemical Formula 1 below.

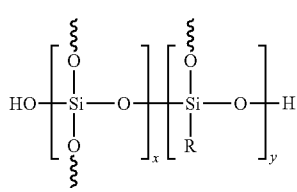

[Chemical Formula 1]

In Chemical Formula 1, each R is a substituent independently selected from a saturated hydrocarbon or an unsaturated hydrocarbon having from 1 to about 25 carbon atoms, and each of x and y independently may be from 1 to about 200. It should be understood that the individual x and y units of the siloxane may be intermingled and are not limited to a contiguous chain of x siloxane units covalently linked to a contiguous chain of y siloxane units, although this combination is possible, and is within the scope of Chemical Formula 1. Also, in an embodiment of the present invention in Chemical Formula 1, each of the R groups may be independently selected from the group consisting of a methyl group, a vinyl group, and a phenyl group. The wavy line of Chemical Formula 1 indicates that a bond from the oxygen atom of an x-unit or of a y-unit of the siloxane is bonded to a hydrogen atom or to another x siloxane unit or another y siloxane unit. In a case that the oxygen atom of an x-unit or a y-unit of the siloxane is bonded to another x siloxane unit or another y siloxane unit, the oxygen atom of the x-unit or the y-unit of the siloxane in Chemical Formula 1 is bonded to a silicon (Si) atom of another x siloxane unit or another y siloxane unit. Therefore, Chemical Formula 1 may have a pattern such that a plurality of x-units or a plurality of y-unit or any a combination thereof may occur in up/down direction and in left/right direction.

The passivation layer solution composition according to an exemplary embodiment of the present invention may include a solvent including propylene glycol monomethylether, propylene glycol monoethylacetate, or propylene glycol monomethylacetate. Also, the solvents included in the passivation layer solution composition may be used individually or two or more may be mixed for use, and the solvent having a boiling point lower than 100° C. and the solvent (a high boiling solvent) having a boiling point from 120° C. to 160° C. may be mixed for use. The high boiling solvent is volatilized in a temperature less than a temperature that coating, drying, and hardening are performed when forming a film structure to prevent a void, and dries the film at a low speed, having a function of improving flatness of the film structure. With this combination of solvents, a solvent selected from the group including ethanol, 2-propanol, and 2-butanol, and the solvent selected from the group including propylene glycol monomethylether, propylene glycol monomethylacetate, methyl isobutyl ketone, and n-propylacetate may be mixed for the above-described use.

In an embodiment, the organic siloxane resin represented by Chemical Formula 1 may be included in the passivation layer solution composition to a content of from about 4 wt % to about 25 wt %. Also, the molecular weight of the organic siloxane resin may be from about 100 to about 10,000.

In an embodiment, the passivation layer solution composition according to the present exemplary embodiment may further include a thermal hardener having a content of from about 1 wt % to about 5 wt %. However, in an embodiment of the present invention, the thermal hardener may be omitted.

In an embodiment, the organic siloxane resin of Chemical Formula 1 is formed by polymerization through a hydrolase reaction of a compound A and a compound B represented by Chemical Formula 2 and Chemical Formula 3 below. The compound A has a structure randomly including methylsiloxane, vinylsiloxane, and tetrahydroxysiloxane in a predetermined ratio, and the compound B has a structure randomly including phenylsiloxane, vinylsiloxane, and tetrahydroxysiloxane in a predetermined ratio.

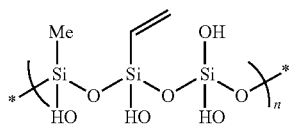

[Chemical Formula 2]

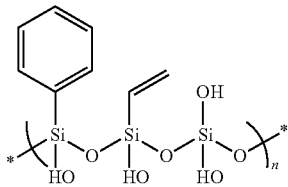

[Chemical Formula 3]

Next, a thin film transistor array panel including a passivation layer formed by using the passivation layer solution composition according to an exemplary embodiment of the present invention will be described.

Figure 2:
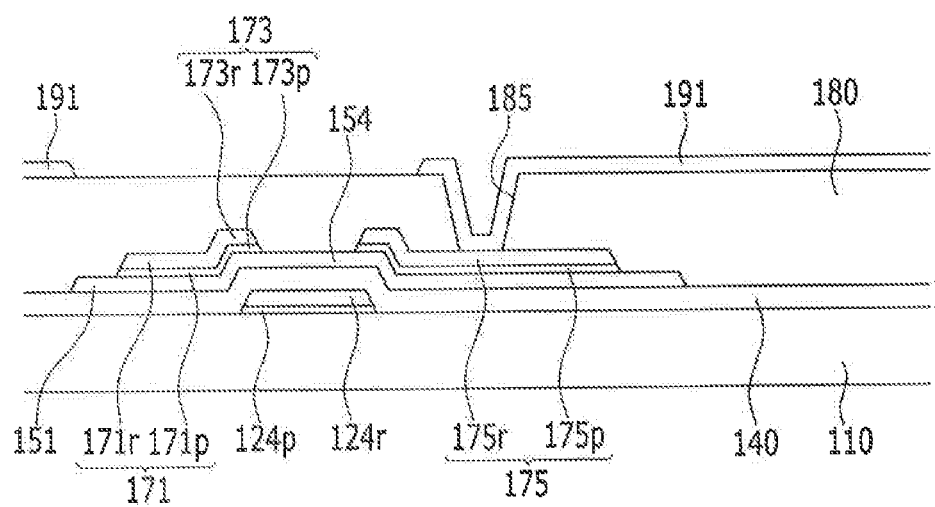
FIG. 2 is a cross-sectional view taken along the line II-II' of FIG. 1.

FIG. 1 is a layout view of one pixel of a thin film transistor array panel according to an exemplary embodiment of the present invention. FIG. 2 is a cross-sectional view taken along the line II-II' of FIG. 1.

Referring to FIGS. 1 and 2, a plurality of gate lines 121 are formed on an insulation substrate 110 made of transparent glass or plastic.

The gate lines 121 transmit gate signals and mainly extend in a horizontal direction. Each gate line 121 includes a plurality of gate electrodes 124 protruding from the gate line 121.

The gate lines 121 and the gate electrodes 124 may have a dual-layer structure configured by lower layer 124p and upper layer 124r. The lower layer 124p may be comprise a metal or a metal alloy selected from molybdenum (Mo), a molybdenum alloy, chromium (Cr), a chromium alloy, titanium (Ti), a titanium alloy, tantalum (Ta), a tantalum alloy, manganese (Mn) and a manganese alloy. The upper layer 124r may comprise a metal or a metal alloy selected from aluminum (Al), an aluminum alloy, silver (Ag), a silver alloy, and copper (Cu) and a copper alloy. In the present exemplary embodiment, the gate lines 121 and the gate electrodes 124 have the dual-layered structure, however they are not limited thereto, and may be made of a single-layered structure or a triple-layered structure. In the case of a triple-layer structure, layers having different physical properties may be combined in the gate lines 121 and the gate electrodes 124.

In an embodiment of the invention, a gate insulating layer 140 made of an insulating material such as silicon oxide, silicon nitride, or silicon nitroxide is formed on the gate line 121.

In an embodiment of the invention, a plurality of semiconductor layers 151 comprising an oxide semiconductor are formed on the gate insulating layer 140. The semiconductor layers 151 mainly extend in a longitudinal direction, and include a plurality of projections 154 extending toward the gate electrodes 124.

In an embodiment of the invention, a plurality of data lines 171 connected to a plurality of source electrodes 173 and a plurality of drain electrodes 175 are formed on the semiconductor layer 151.

In an embodiment of the invention, the data lines 171 transmit a data signal and extend in the longitudinal direction intersecting the gate lines 121. Each data line 171 is connected to a plurality of source electrodes 173 having a "U" shape and extending toward the gate electrode 124.

In an embodiment of the invention, the drain electrode 175 is separated from the data line 171 and extends in the center of the "U" shape of the source electrode 173. The shape of the source electrode 173 and the drain electrode 175 may be variously changed.

In an embodiment of the invention, a the data wire layer (171, 173, and 175) including the data line 171, the source electrode 173, and the drain electrode 175 has a dual-layer structure of lower layers 171p, 173p, and 175p, and upper layers 171r, 173r, and 175r. The lower layers 171p, 173p, and 175p may include a metal or a metal alloy selected from molybdenum (Mo) and a molybdenum alloy, chromium (Cr) and a chromium alloy, titanium (Ti) and a titanium alloy, tantalum (Ta) and a tantalum alloy, and manganese (Mn) and a manganese alloy, and the upper layer 171r, 173r, and 175r may include a metal or a metal alloy selected from aluminum (Al) and a aluminum alloy, silver (Ag) and a silver alloy, and copper (Cu) and a copper alloy.

In an embodiment of the invention, a the projection 154 of the semiconductor layer 151 includes an exposed portion that is not covered by the data line 171 and the drain electrode 175 and a portion that is disposed between the source electrode 173 and the drain electrode 175. The semiconductor layer 151 has substantially the same planar pattern as the data line 171 and the drain electrode 175 except for the exposed portion of the projection 154.

In an embodiment of the invention, one gate electrode 124, one source electrode 173, and one drain electrode 175 form one thin film transistor (TFT) along with the projection 154 of the semiconductor layer 151, and a channel of the thin film transistor are formed in the projection 154 between the source electrode 173 and the drain electrode 175.

In an embodiment of the invention, a passivation layer 180 is formed on the data line 171, the drain electrode 175, and the exposed projection 154 of the semiconductor layer. The passivation layer 180 includes the organic siloxane resin represented by Chemical Formula 1 below.

[Chemical Formula 1]

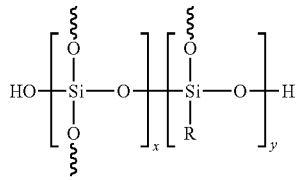

In Chemical Formula 1, each wavy line indicates a bond to an H atom or to an x siloxane unit or a y siloxane unit, or a bond to an x siloxane unit or a y siloxane unit of another siloxane chain comprising x siloxane units or y siloxane units or a combination thereof and each of the R groups is independently selected from a saturated hydrocarbon or an unsaturated hydrocarbon having from 1 to about 25 carbon atoms, and x and y may each independently be from 1 to about 200. Also, in Chemical Formula 1, each of the R groups may independently be a substituent selected from the group consisting of a methyl group, a vinyl group, and a phenyl group.

In an embodiment, the passivation layer 180 has a plurality of contact holes 185 exposing a portion of the drain electrode 175.

In the thin film transistor array panel according to an exemplary embodiment, an additional capping layer is not formed between the passivation layer 180 and the data wire layer (171, 173, and 175).

In an embodiment, a plurality of pixel electrodes 191 are formed on the passivation layer 180. Each pixel electrode 191 is physically and electrically connected to the drain electrode 175 through the contact hole 185, receiving a data voltage from the drain electrode 175. The pixel electrode 191 that has received the data voltage generates an electric field, together with a common electrode (not shown, but may be formed on the opposite display panel or a thin film transistor array panel) that receives a common voltage, determining the direction of the liquid crystal molecules in the liquid crystal layer (not shown) between the two electrodes. The pixel electrode 191 and the common electrode constitute a capacitor (hereafter referred to as a "liquid crystal capacitor") to maintain the voltage even after the thin film transistor is turned off.

In an embodiment, the pixel electrode 191 may form a storage capacitor by overlapping a storage electrode line (not shown), such that the performance of the liquid crystal capacitor that maintains the voltage can be improved. The pixel electrode 191 may be made of a transparent conductor such as ITO or IZO.

The thin film transistor array panel of the liquid crystal display is described as one example, however the present exemplary embodiment also may be applied to an organic light emitting device.

FIG. 3 to FIG. 11 are cross-sectional views taken along the line II-II' of FIG. 1 to explain a manufacturing method of a thin film transistor array panel according to an exemplary embodiment of the present invention.

Figure 3:
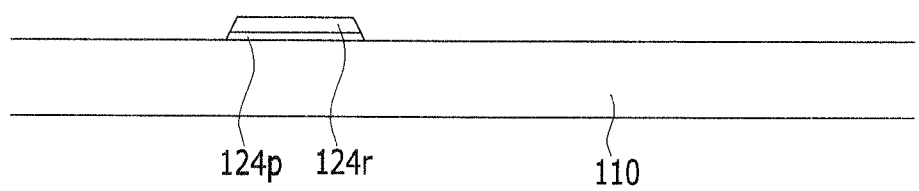
FIGS. 3-11 are cross-sectional views taken along the line II-II' of FIG. 1 to explain a manufacturing method of a thin film transistor array panel according to an exemplary embodiment of the present invention.

Referring to FIG. 3, a metal or metal alloy selected from molybdenum (Mo) and a molybdenum alloy, chromium (Cr) and a chromium alloy, titanium (Ti) and a titanium alloy, tantalum (Ta) and a tantalum alloy, and manganese (Mn) and a manganese alloy is deposited on an insulation substrate 110 made of transparent glass or plastic, and a metal or metal alloy selected from aluminum (Al) and a aluminum alloy, silver (Ag) and a silver alloy, and copper (Cu) and a copper alloy is deposited to form dual layers, and they are patterned to form a gate line 121 including a gate electrode 124.

Thereafter, in an embodiment the photosensitive film (not shown) is layered and patterned, and the lower layer 124p and upper layer 124r are etched by using the patterned photosensitive film (not shown) as a mask. At this time, the etchant used may be an etchant that is capable of simultaneously etching the lower layer 124p and upper layer 124r.

Figure 4:
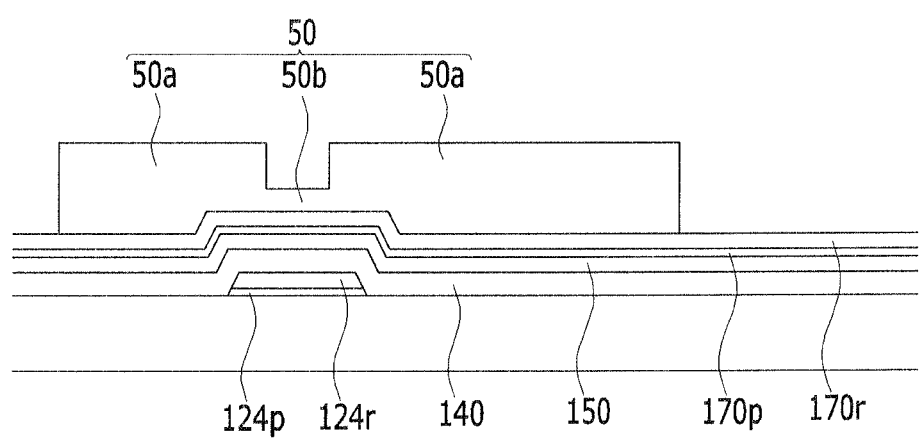

Referring to FIG. 4, in an embodiment the gate insulating layer 140, an oxide layer 150, a lower metal layer 170p, and an upper metal layer 170r are deposited on the gate line 121s and the gate electrodes 124.

The oxide layer 150 includes at least one metal selected from zinc (Zn), indium (In), tin (Sn), gallium (Ga), and hafnium (I-If), the lower metal layer 170p may include a lower layer and an upper layer, and the lower layer may include a metal or a metal alloy selected from molybdenum (Mo) and a molybdenum alloy, chromium (Cr) and a chromium alloy, titanium (Ti) and a titanium alloy, tantalum (Ta) and a tantalum alloy, and manganese (Mn) and a manganese alloy, and the upper metal layer 170r may include a metal or a metal alloy selected from aluminum (Al) and an aluminum alloy, silver (Ag) and a silver alloy, and a copper (Cu) and a copper alloy.

A photosensitive film (a photoresist) is formed thereon and is patterned to form a first photosensitive film pattern 50. The first photosensitive film pattern 50 has a first region 50a with a thick thickness and a second region 50b with a thin thickness. A thickness difference of the first photoresist pattern 50 may be formed by irradiating light amount by using a mask or may be formed by using a reflow method. In the case where the light amount is controlled, a slit pattern, a lattice pattern, or a semi-transparent layer may be formed on the mask. The second region 50b having a thin thickness corresponds to a position at which the channel region of the thin film transistor is formed.

Figure 5:
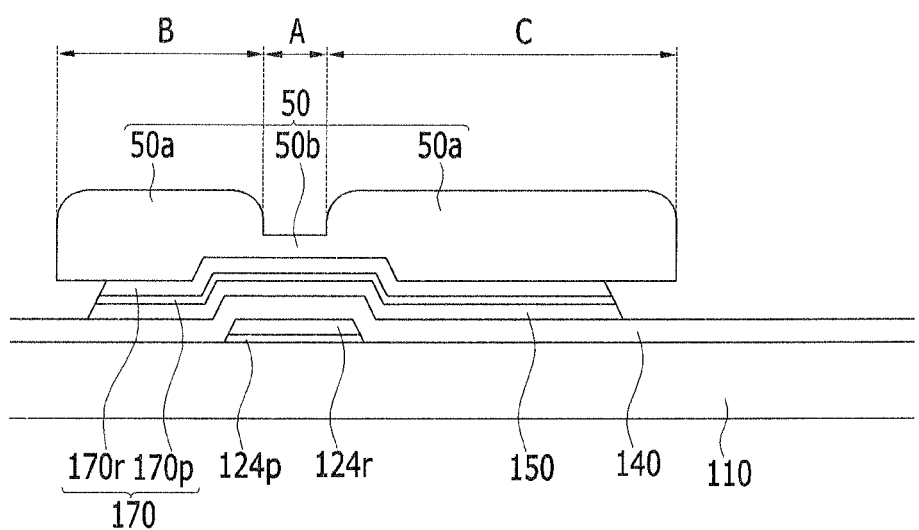

Referring to FIG. 5, in an embodiment by using the first photosensitive film pattern 50 as the mask, the lower metal layer 170p and the upper metal layer 170r are etched by using an etchant that is capable of simultaneously etching the lower metal layer 170p and the upper metal layer 170r. Here, the etchant used may be the same as the etchant used when etching the lower layer 124p and the upper layer 124r of the gate lines 121 and the gate electrodes 124.

In an embodiment as shown in FIG. 5, if the lower metal layer 170p and the upper metal layer 170r are etched, the side of the lower metal layer 170p and the upper metal layer 170r covered by the first photosensitive film pattern 50 is also etched, and as a result the boundary of the lower metal layer 170p and the upper metal layer 170r is disposed inside regions A, B, and C where the first photosensitive film pattern 50 is formed.

At this time, the etchant etching the lower metal layer 170p and the upper metal layer 170r does not etch the gate insulating layer 140 or the oxide layer 150.

In additional, the oxide layer 150 is etched by using the first photosensitive film pattern 50 as the mask.

Figure 6:
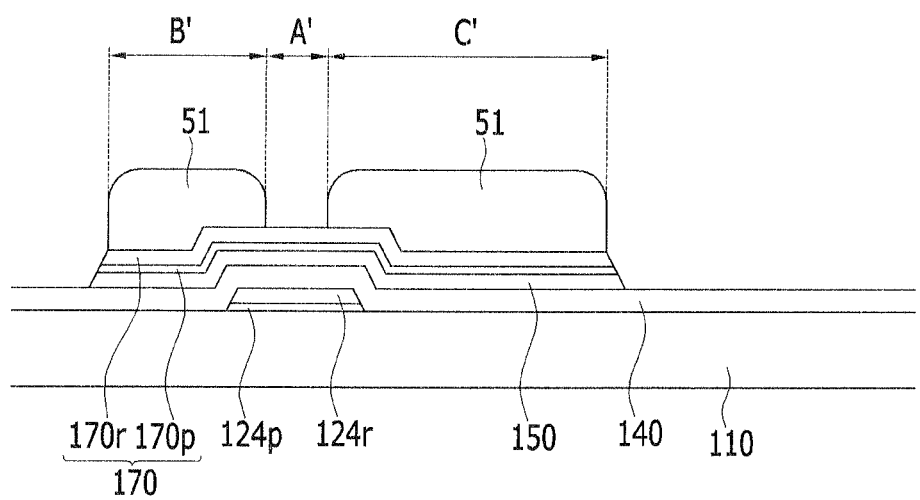

In an embodiment referring to FIG. 6, the second region 50b having the thin thickness in FIG. 5 is removed through an etch-back process. At this time, the first region 50a is also etched such that the width and height thereof are reduced, and the second photosensitive film pattern 51 of FIG. 6 is formed. The second photosensitive film 51 is formed at regions A', B', and C' that are smaller than regions A, B, and C of the first photosensitive film pattern 50 as shown in FIG. 5.

Figure 7:
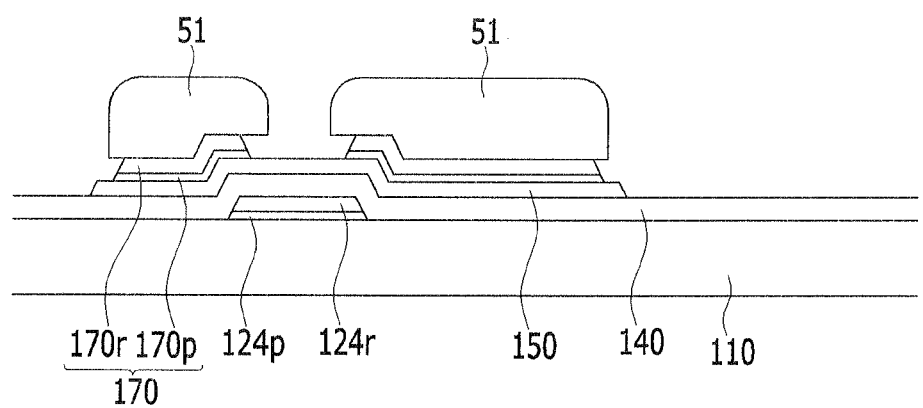

In an embodiment referring to FIG. 7, the lower metal layer 170p and the upper metal layer 170r are etched with the etchant by using the second photosensitive film pattern 51 as the mask. Here, the upper metal layer 170r may be wet-etched, and then the lower metal layer 170p may be dry-etched.

At this time, the lower metal layer 170p is divided, forming the data line (171p and 171r), the source electrode (173p and 173r), and the drain electrode (175p and 175r) of the dual-layered structure. Also, the upper surface of the oxide layer 150 is exposed and then the oxide semiconductor layer 151 including the projection 154 formed with the channel of the thin film transistor is formed.

As described above, if photoresist patterns having different thicknesses are used, the oxide semiconductor 151 and 154 has substantially the same planar pattern as the lower layers 171p, 173p, and 175p of the data lines 171, the source electrodes 173, and the drain electrodes 175. Meanwhile, the oxide semiconductor layer (151 and 154) except for the exposed portion between the drain electrode 175 and the source electrode 173 has substantially the same plane pattern as the data line 171, the source electrode 173, and the drain electrode 175.

Figure 8:
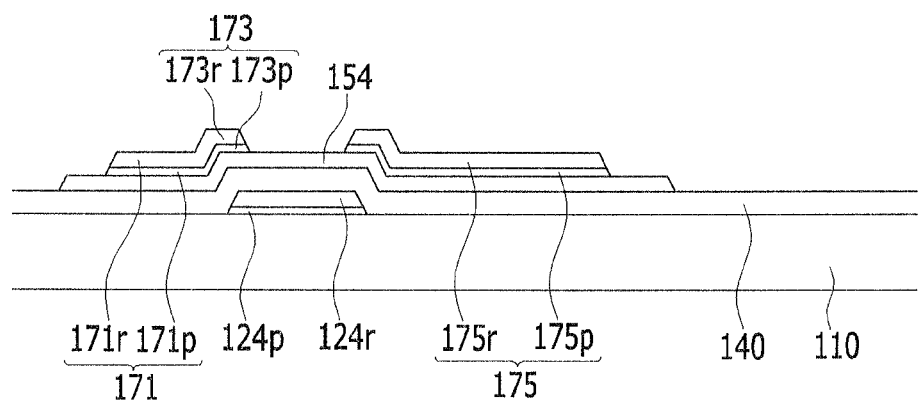

Next, referring to FIG. 8, the photosensitive film pattern is removed through ashing.

Figure 9:
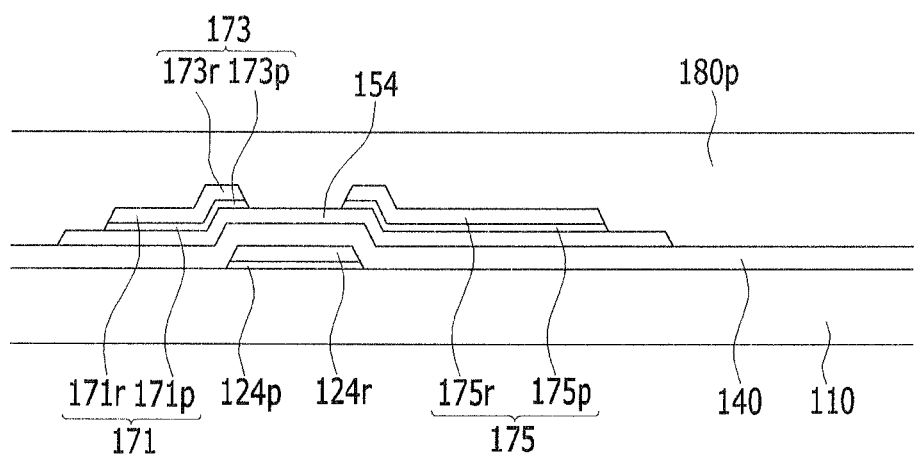

Next, referring to FIG. 9, in an embodiment, the passivation layer solution including the organic siloxane resin represented by Chemical Formula 1, the solvent such as propylene glycol monomethylether or propylene glycol monoethylacetate, and the thermal hardener are coated on the gate insulating layer 140, the source electrode 173, the drain electrode 175, and the projection 154 of the oxide semiconductor layer 151 to form a preliminary passivation layer 180p.

[Chemical Formula 1]

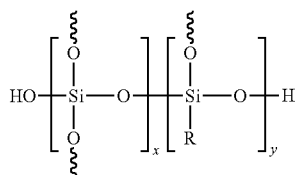

Here, in Chemical Formula 1, each of the groups R is independently selected from a saturated hydrocarbon and an unsaturated hydrocarbon having from 1 to about 25 carbon atoms, and x and y may each be from 1 to about 200. Also, in Chemical Formula 1, each R may independently be a substituent selected from the group consisting of a methyl group, a vinyl group, and a phenyl group. The wavy line of Chemical Formula 1 may include that the oxygen atom of x-unit or an y-unit of the siloxane is bonded to a hydrogen atom or another x siloxane unit or another y siloxane unit. In a case that the oxygen atom of an x-unit or a y-unit of the siloxane is bonded to another x siloxane unit or another y siloxane unit, the oxygen atom of x-unit or an y-unit of the siloxane in Chemical Formula 1 is bonded to a silicon (Si) atom in another x siloxane unit or another y siloxane unit. Therefore, Chemical Formula 1 may have a pattern such that a plurality of x-units or a plurality of y-unit or a combination thereof may occur in up/down direction and in left/right direction.

The coating of the passivation layer solution may use a method of spin coating, dip coating, bar coating, screen printing, slide coating, roll coating, spray coating, slot coating, dip-pen nanolithography, inkjet printing, or nano-dispensing.

Figure 10:
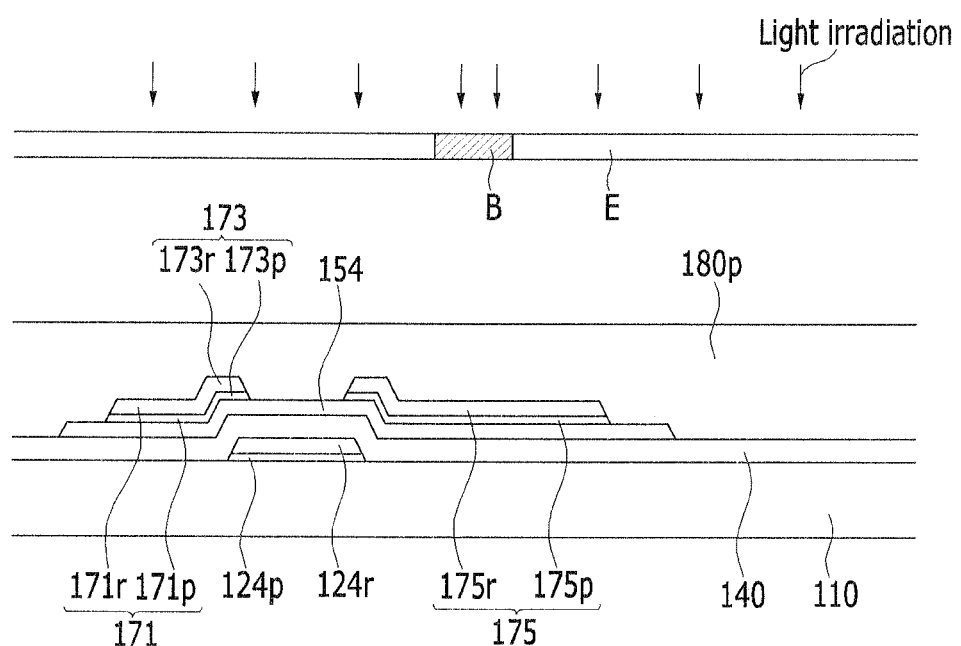
Figure 11:
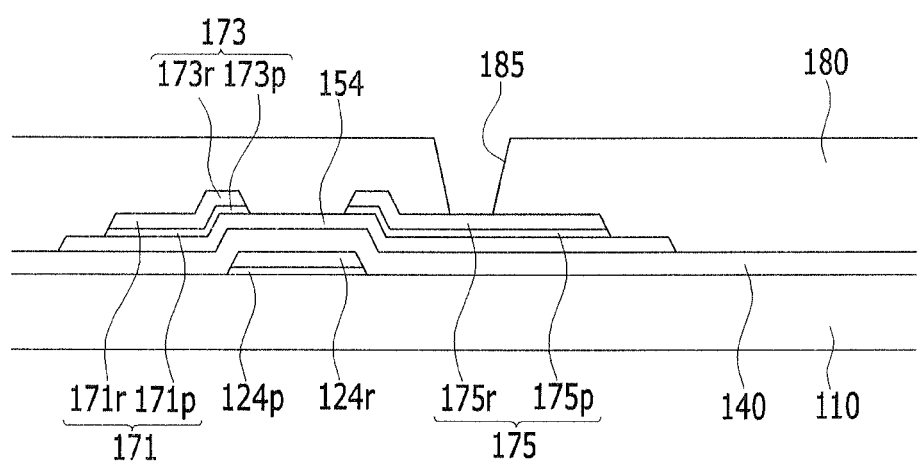

Referring to FIG. 10 and FIG. 11, in an embodiment, a mask having an exposing region E and a blocking region B is aligned on the preliminary passivation layer 180p, and then light such as ultraviolet light is irradiated thereto. The light is blocked at a portion corresponding to the contact hole 185 to be formed among the preliminary passivation layer 180p such that this portion is removed later. Accordingly, the passivation layer 180 having the contact hole 185 is formed. Next, the passivation layer 180 may be hardened through heat treatment.

Conventionally, when forming the passivation layer 180 by using chemical vapor deposition (CVD), it is difficult to form a thick layer because of technique limitations. Accordingly, a flatness layer to planarize the layer must be additionally formed. However, in an exemplary embodiment, the passivation layer 180 is formed through the solution process by using the coating method such that the flat passivation layer 180 having a thick thickness may be formed through a single process. Accordingly, in an embodiment of the present invention, it is not necessary to form the flatness layer to planarize the layer.

Also, the passivation layer 180 is formed through the solution process such that oxygen gas may be prevented from being generated in the process of forming the silicon oxide by the conventional CVD method that oxidizes copper. Accordingly, in an embodiment of the present invention, it is not necessary to form a capping layer between the upper layers 171q, 173q, and 175q of the data line 171, the source electrode 173, and the drain electrode 175 as the main wiring layer and the passivation layer 180 such that the manufacturing process is simplified.

Also, according to an exemplary embodiment of the present invention, a different passivation layer material from the conventional is used such that that generation of hydrogen ($H_2$) that degrades the thin film transistor characteristic may be prevented when forming the passivation layer that includes silicon nitride (SiNx).

Next, a transparent conductor such as indium tin oxide (ITO) or indium zinc oxide (IZO) is deposited and patterned to form the pixel electrode 191 electrically connected to the drain electrode 175, as shown in FIG. 2.

Figure 12:
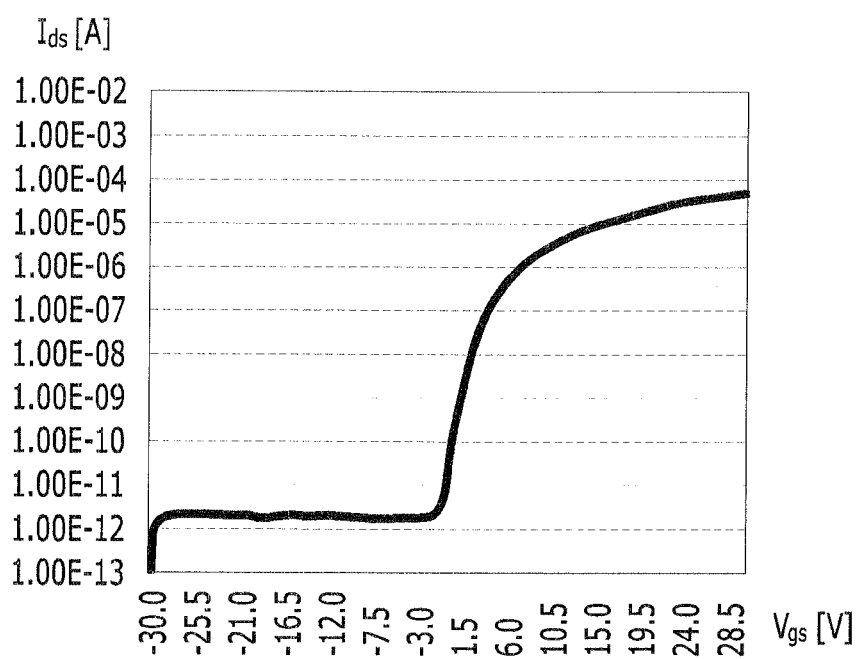
FIG. 12 is a graph showing a characteristic of a thin film transistor according to an exemplary embodiment of the present invention.

FIG. 12 is a graph showing a characteristic of a thin film transistor according to an exemplary embodiment of the present invention. In detail, FIG. 12 shows a drain current (Ids) according to a gate voltage (Vgs) in the thin film transistor including the passivation layer including the organic siloxane resin represented by Chemical Formula 1.

Referring to FIG. 12, the characteristic of the thin film transistor is shown according to the change of the drain current (Ids) according to the gate voltage (Vgs).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

| 50 | first photosensitive film pattern | 51 | second photosensitive film pattern |
|---|---|---|---|
| 110 | substrate | 121 | gate line |
| 151 | semiconductor layer | 154 | protrusion |
| 171 | data line | 173 | source electrode |
| 175 | drain electrode | 180 | passivation layer |

What is claimed is:

1. A thin film transistor array panel comprising:
a substrate;
a gate line, a semiconductor layer, a source electrode, a data line, and a drain electrode disposed on the substrate; and
a passivation layer disposed on the gate line, the semiconductor layer, and the data line, wherein the semiconductor layer is in direct contact with the passivation layer, the passivation layer including an organic siloxane resin represented by Chemical Formula 1 below:

[Chemical Formula 1]

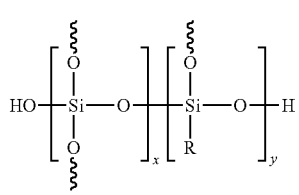

wherein in Chemical Formula 1, R is at least one substituent selected from the group consisting of a saturated hydrocarbon or an unsaturated hydrocarbon having from 1 to about 25 carbon atoms, and x and y are each independently an integer from 1 to about 200,
wherein each wavy line indicates a bond to an H atom or to an x siloxane unit or a y siloxane unit, or a bond to an x siloxane unit or a y siloxane unit of another siloxane chain comprising x siloxane units or y siloxane units or a combination thereof.

2. The thin film transistor array panel of claim 1, wherein the semiconductor layer is formed of an oxide semiconductor.

3. The thin film transistor array panel of claim 2, wherein the gate line includes a lower layer including at least one of titanium, tantalum, and molybdenum; and an upper layer including copper or a copper alloy.

4. The thin film transistor array panel of claim 3, wherein the data line includes a lower layer including at least one of titanium, tantalum, and molybdenum; and an upper layer including copper or a copper alloy.

5. The thin film transistor array panel of claim 4, further comprising
a pixel electrode disposed on the passivation layer,
wherein the passivation layer has a contact hole and the pixel electrode is connected to the drain electrode through the contact hole.

6. The thin film transistor array panel of claim 5, wherein in Chemical Formula 1, R includes at least one substituent selected from the group consisting of a methyl group, a vinyl group, and a phenyl group.

7. The thin film transistor array panel of claim 6, wherein the organic siloxane resin has a molecular weight of from about 100 to about 10,000.

8. The thin film transistor array panel of claim 1, further comprising
a gate insulating layer disposed on the substrate.

9. The thin film transistor array panel of claim 8, wherein the gate insulating layer includes at least one insulating material selected from the group consisting of silicon oxide, silicon nitride, and silicon oxynitride.

* * * * *